April 25, 1961 A. HAHNEL 2,981,899
FREQUENCY DIVIDER
Filed Aug. 12, 1958
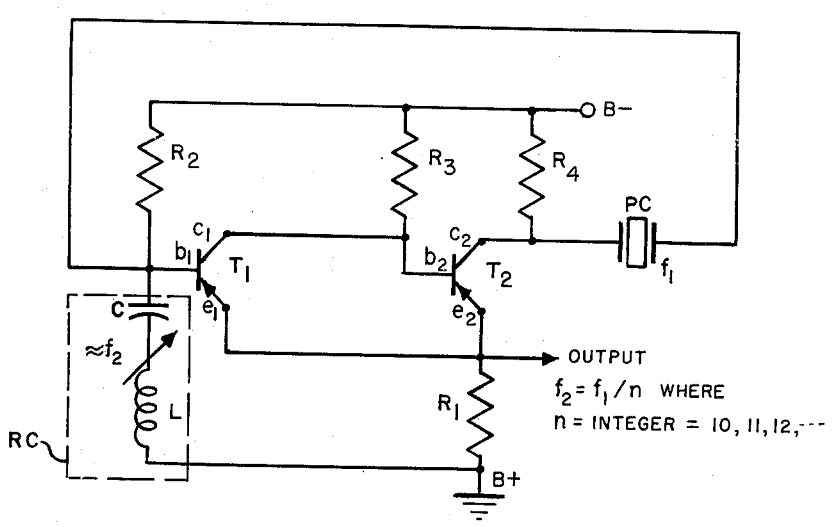
INVENTOR,
ALWIN HAHNEL.
BY Harry M. Saragovitz
ATTORNEY.

2,981,899
Patented Apr. 25, 1961

2,981,899

FREQUENCY DIVIDER

Alwin Hahnel, Rochester, N.Y., assignor to the United States of America as represented by the Secretary of the Army Filed Aug. 12, 1958, Ser. No. 754,696

4 Claims. (Cl. 331—116)

(Granted under Title 35, U.S. Code (1952), sec. 266)

The invention described herein may be manufactured and used by or for the Government for governmental purposes, without the payment of any royalty thereon.

This invention relates to frequency dividers and particularly to frequency dividers of the locked-in oscillator type.

A general object of the invention is to produce with a simple and economical circuit arrangement by the process of frequency division a number of stable electric waves of frequencies that are subharmonics of a given frequency. Another general object is to improve frequency dividers having variable frequency division ratios.

Another object is to provide with a minimal amount of circuitry crystal control of frequencies below the frequency range for which quartz crystals can be produced.

A related object is to adapt an oscillator of the locked-in type so that it will provide crystal-controlled low frequency outputs that are integrally related to the fundamental frequency of a quartz piezoelectric crystal.

Another object is to produce with a relatively simple circuit arrangement containing inexpensive circuit elements a plurality of stable low frequency signals comprising a series of adjacent subharmonics of a given fundamental frequency, which circuit arrangement is such as to enable ready selection therefrom of any desired one of the generated subharmonic signals without the use of auxiliary frequency mixers and selective circuits.

The frequency divider in accordance with the invention for attaining these objects is basically an electrical oscillation network adapted to oscillate simultaneously at two widely different frequencies one of which is the crystal-controlled frequency and the other a selected subharmonic of that frequency. In one embodiment, this frequency divider comprises two transistor amplifying triodes with associated means for applying biasing voltages to the transistor electrodes, a piezoelectric crystal for the control of the main frequency and a LC resonant circuit tunable to the desired subharmonic of the main frequency, interconnected to form a regenerative closed loop network having one feedback path for the crystal frequency $f_1$ and a separate one for the oscillations at the desired subharmonic $f_2$ of that frequency. With proper selection of circuit constants in the two feedback sections of this regenerative network so that both signals $f_1$ and $f_2$ are simultaneously transmitted through the two non-linear transistor devices, these signals necessarily are harmonically related. The lower frequency section of this network locks itself to a subharmonic of the crystal frequency $f_1$ determined by the tuning of the LC circuit, and thus provides a crystal-controlled output at a frequency substantially lower than $f_1$; and a wave of the desired subharmonic frequency may be taken off directly at any suitable point in the loop circuit.

The various objects and features of the invention will be better understood from the following complete description thereof when it is read in conjunction with the drawing which shows a schematic circuit diagram of one embodiment of the frequency divider of the invention.

Referring to the drawing, the frequency dividing circuit shown therein employs for its main elements two transistor amplifying devices $T_1$ and $T_2$ usually referred to as transistor triodes, respectively having the usual base electrodes $b_1$ and $b_2$, emitter electrodes $e_1$ and $e_2$ and collector electrodes $c_1$ and $c_2$, which transistor devices may be of the P-N-P type as indicated conventionally by the direction of the arrows associated with the emitter electrodes $e_1$ and $e_2$ in the drawing. In order to make the transistor triodes $T_1$ and $T_2$ operate as amplifiers, their respective emitter electrodes $e_1$ and $e_2$, which are connected directly to each other, are positively biased and their respective collector electrodes $c_1$ and $c_2$ are negatively biased, with respect to their base electrodes $b_1$ and $b_2$, respectively, by the connection of the emitter electrodes $e_1$ and $e_2$ to the positive terminal (B+) of an associated battery of suitable voltage value through the common feed resistor $R_1$, and the connection of the base electrodes $b_1$ and $b_2$ and the collector electrodes $c_1$ and $c_2$ to the negative terminal (B−) of the same battery through feed resistors $R_2$, $R_3$ and $R_4$ of suitably selected resistance values.

A regenerative closed loop network including the two transistor triodes $T_1$ and $T_2$ is formed by the following other connections. The emitter electrode $e_1$ of the transistor triode $T_1$ is connected directly to the emitter electrode $e_2$ of the transistor triode $T_2$. The collector electrode $c_1$ of transistor triode $T_1$ is connected directly to the base electrode $b_2$ of the transistor triode $T_2$. A series connection is provided from the collector electrode $c_2$ of the transistor triode $T_2$ to the base electrode $b_1$ of transistor triode $T_1$ through the piezoelectric crystal PC adapted for series resonance at a selected fundamental frequency $f_1$, to provide a regenerative feedback path for the crystal frequency $f_1$. A separate series connection is provided from the emitter electrode $e_2$ of the transistor triode $T_2$ to the base electrode $b_1$ of transistor triode $T_1$ through the resistor $R_1$ and a resonant circuit RC comprising the inductor L and the capacitor C in series therewith, adapted for variable tuning over a wide range of adjacent subharmonics of the fundamental frequency $f_1$, to provide a regenerative feedback path for any desired harmonic $f_2$ within that range to which the circuit RC is tuned.

The waveform observed at any point in this regenerative network when the transistor triodes $T_1$ and $T_2$ are operatively energized, is periodic at the subharmonic frequency $f_2$ and, therefore, contains only spectrum components that are harmonically related to $f_2$, one of which is identical to the frequency $f_1$ of the quartz crystal PC. Suitable selection of the circuit constants of the two feedback paths so that both signals $f_1$ and $f_2$ are transmitted simultaneously through the two transistor triodes $T_1$ and $T_2$ results necessarily in the two signals being harmonically related. This applies also in the undesired case where the freqeuncy determining LC circuit RC is series tuned such that its resonant frequency is halfway between the frequencies of two adjacent subharmonics of the fundamental frequency $f_1$. For this tuning condition of the circuit RC, the subharmonic frequency $f_2$ established is such that one of its harmonics is identical to the second harmonic of $f_1$.

A stable wave of the subharmonic frequency $f_2=f_1/n$, where $n$ is an integer=10, 11, 12, . . . , may be taken off directly from any convenient point in the regenerative oscillation network, for example, as indicated in the drawing, across the resistor $R_1$.

A crystal-controlled low frequency step oscillator substantially as shown in the drawing designed to provide frequency division in the ratio of one hundred to one, has been used in a transistorized version of a conventional radio receiver. As the frequency divider of the invention does not require the frequency and selective circuits of conventional frequency dividers, it is especially useful in systems where miniaturization of circuit components or economy of circuitry is essential, such as quartz crystal-controlled low frequency standards.

The particular frequency division ratio specified above for the frequency divider in accordance with the invention is given by way of example only. It is to be understood that by proper selection and adjustment of the circuit components other frequency division ratios differing substantially from the ratio given may be obtained in accordance with the invention.

Various modifications of the circuit illustrated and described which are within the spirit and scope of the invention will occur to persons skilled in the art.

What is claimed is:

1. A frequency divider of the locked-in oscillator type comprising an amplifier including at least one pair of energized transistor amplifying triodes each having a base electrode and two output electrodes including an emitter and a collector, connected in tandem with their emitters directly connected to each other, the collector of the output triode connected directly to the base electrode of the input triode, voltage supply means for positively biasing the emitter and negatively biasing the collector of each triode with respect to its base electrode, and two feedback paths each including individual frequency-determining means, respectively connected between a different output electrode of the output triode and the base electrode of the input triode of the amplifier and forming therewith a regenerative closed loop network oscillating under control of said frequency-determining means simultaneously at two widely separated frequencies one of which is a predetermined main frequency $f_1$ and the other of which is a selected subharmonic $f_2$ of said main frequency to cause signals of corresponding frequency to be fed back regeneratively over respective ones of the two paths, the relative circuit constants of said two feedback paths being selected such that the fedback signals are simultaneously transmitted through said triodes to maintain the harmonic relationship between them, and an output circuit connected to said network for taking off directly therefrom a stable wave of the selected subharmonic frequency $f_2$.

2. A frequency divider in accordance with claim 1, in which said two separate feedback paths respectively feeding back regeneratively around the loop through the frequency-determining means therein and said triodes, said predetermined main frequency and said selected subharmonic of said main frequency in such a phase relation as to maintain a harmonic relation between them, and said output circuit is coupled to one of said feedback paths for taking off therefrom a sustained wave of the selected subharmonic frequency.

3. A frequency dividing circuit for generating with crystal-controlled accuracy stable waves of different frequencies in a range too low for direct crystal control, comprising an amplifier with two cascade-connected energized, transistor triode stages each having base, emitter and collector electrodes, with their emitters connected directly to each other, the collector of the output stage directly connected to the base electrode of the input stage, voltage supply means for positively biasing the emitter and negatively biasing the collector of each of said triode stages with respect to its base electrode, and two separate regenerative feedback paths connected between the emitter electrode and the collector electrode, respectively, of the output triode and the base electrode of the input triode of said amplifier and forming therewith a regenerative closed loop network, one of said paths including in series therewith a piezoelectric crystal resonant at a predetermined main frequency $f_1$, for regeneratively feeding back a signal of that frequency and the second of said paths including in series therewith a series inductance-capacitance resonant circuit selectively tunable to any desired subharmonic $f_2$ in a plurality of adjacent subharmonics of said main frequency $f_1$, for regeneratively feeding back a signal of the selected subharmonic $f_2$, the circuit constants of the two feedback paths being selected such as to insure that both fedback signals $f_1$ and $f_2$ will be transmitted simultaneously through the two transistor triode stages thereby maintaining a harmonic relationship between these signals, and output means for taking off a generated signal of the selected subharmonic frequency $f_2$ directly from said regenerative network.

4. A frequency divider comprising two transistor amplifying triodes each having an emitter, a collector and a base electrode, voltage supply means for positively biasing the emitter and negatively biasing the collector of each triode with respect to its base electrode, said triodes being interconnected in tandem to form a regenerative closed loop network in which the emitters of the two triodes are directly connected to each other, the collector of one triode is connected directly to the base electrode of the other triode, the collector of said other triode is connected to the base electrode of said one triode through a series piezoelectric crystal resonant at a predetermined main frequency $f_1$ to provide one regenerative feedback path for signals of that frequency and the emittter of said other triode is connected to the base electrode of said one triode through a resistor and a series inductance-capacitance resonant circuit selectively tunable to any desired subharmonic $f_2$ in a plurality of adjacent subharmonics of said main frequency $f_1$, in series to provide a second regenerative feedback path for signals of the selected subharmonic frequency $f_2$, the circuit constants of the two feedback paths being selected to insure that both signals of frequency $f_1$ and $f_2$ are transmitted simultaneously through the two tandem-connected transistor triodes and thus are maintained in harmonic relationship, and an output circuit connected across the resistor in said second feedback path for taking off therefrom the generated signal of the selected subharmonic frequency $f_2$.

References Cited in the file of this patent

UNITED STATES PATENTS

| | | |
|---|---|---|
| 1,930,278 | Morrison | Oct. 10, 1933 |
| 2,165,517 | Stevenson | July 11, 1935 |
| 2,288,486 | Rivlin | June 30, 1942 |
| 2,721,264 | Selz et al. | Oct. 18, 1955 |
| 2,820,144 | Hermes | Jan. 14, 1958 |
| 2,897,451 | Hammett | July 28, 1959 |